United States Patent [19]

Gupta

[11] Patent Number: 4,511,811

[45] Date of Patent: Apr. 16, 1985

[54] CHARGE PUMP FOR PROVIDING PROGRAMMING VOLTAGE TO THE WORD LINES IN A SEMICONDUCTOR MEMORY ARRAY

[75] Inventor: Anil Gupta, Sunnyvale, Calif.

[73] Assignee: Seeq Technology, Inc., San Jose, Calif.

[21] Appl. No.: 346,891

[22] Filed: Feb. 8, 1982

[51] Int. Cl.³ .................. H03K 19/094; H03K 19/20; H03K 4/02; G11C 8/00

[52] U.S. Cl. .................................... 307/463; 307/449; 307/264; 307/296 A; 307/578; 365/230

[58] Field of Search ............... 307/449, 463, 482, 578, 307/264, 296 A, 227; 365/184, 185, 226, 228, 230, 231; 328/186

[56] References Cited

U.S. PATENT DOCUMENTS 4,263,664 4/1981 Owen et al. ............... 365/230 X
4,368,524 1/1983 Nakamura et al. ......... 307/296 R X
4,374,430 2/1983 Higuchi et al. .............. 307/449 X
4,382,194 5/1983 Nakano et al. .............. 307/482 X
4,404,475 9/1983 Drori et al. ................ 307/296 A X

FOREIGN PATENT DOCUMENTS

WO81/03569 12/1981 PCT Int'l Appl. ............. 365/230

Primary Examiner—Larry N. Anagnos
Attorney, Agent, or Firm—Lyon & Lyon

[57] ABSTRACT

A charge pump for providing programming voltages to the word lines of a semiconductor memory array is disclosed. The charge pump, configured as a combination of enhancement and native MOS transistors, prevents DC current from flowing from the source of the programming voltage to ground through unselected word lines, and thereby permits the design of semiconductor programmable memory arrays having on-chip programming voltage generation, allowing for design of semiconductor programmable memory arrays which operate from a single voltage power supply.

1 Claim, 5 Drawing Figures

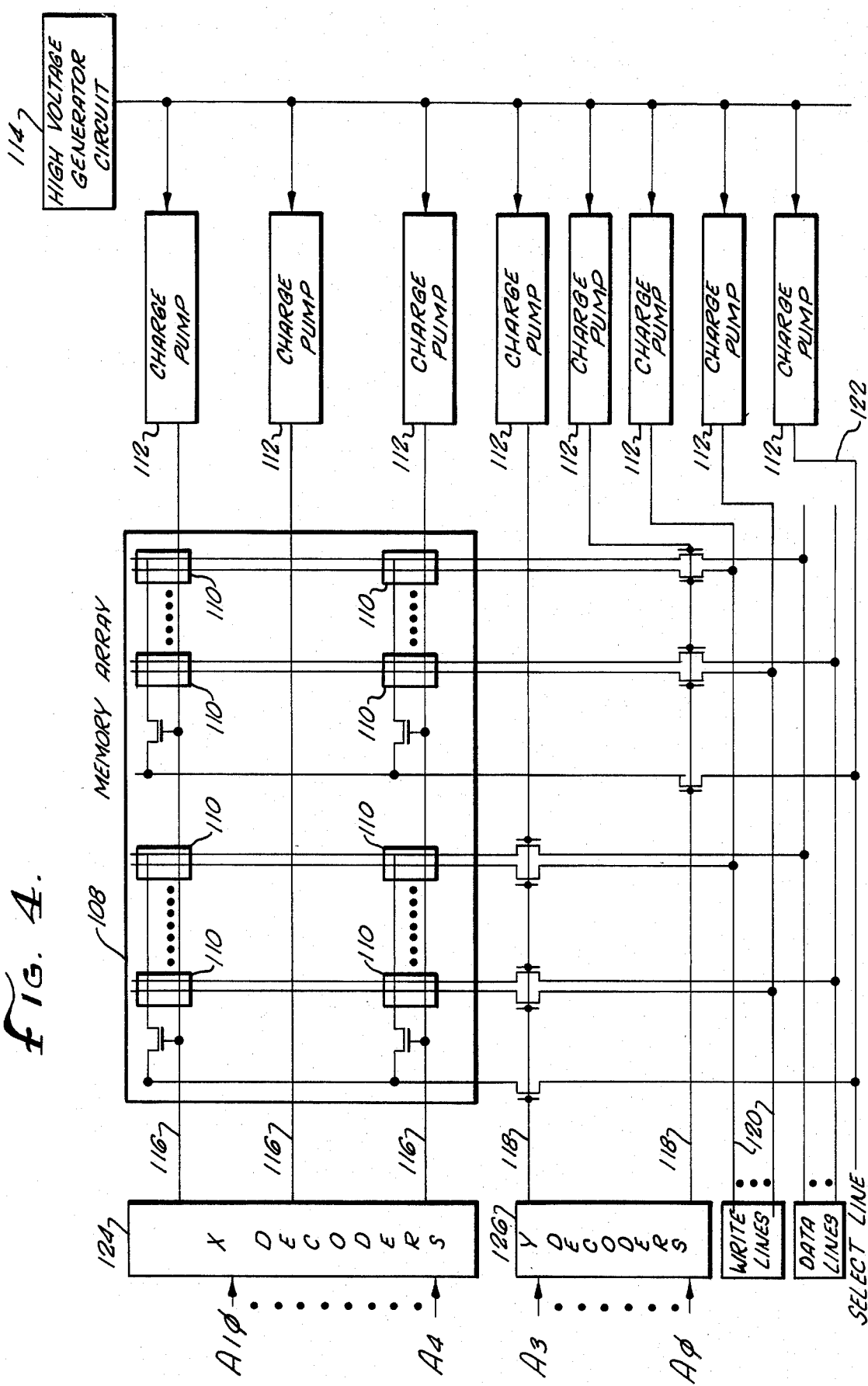

CHARGE PUMP FOR PROVIDING PROGRAMMING VOLTAGE TO THE WORD LINES IN A SEMICONDUCTOR MEMORY ARRAY

FIELD OF THE INVENTION

The present invention relates to peripheral devices for use with semiconductor memories and is more particularly directed to a charge pump for raising the voltage of a memory array word line to a desired high value during memory array programming operations.

BACKGROUND OF THE INVENTION

The use of MOS floating gate storage devices in semiconductor memories has increased rapidly in recent years. A typical MOS floating gate storage device includes a floating gate structure disposed over the surface of a semiconductor substrate between spacedapart source and drain regions. A control gate is then vertically aligned with the floating gate. In order to program the storage device, a potential is applied to the control gate, causing charge carriers to travel from the semiconductor substrate to the floating gate, and in the process modifying the threshold voltage in the channel region established between the spacedapart source and drain regions. During read operations, the presence or absence of charge carriers on the floating gate can be determined in binary fashion by simply measuring the presence or absence of current flow through the storage device channel region in response to voltage potentials applied to the storage device drain region. When floating gate storage devices of the type described above are incorporated in an EEPROM memory array, individual floating gates are defined for each storage device, but a single conductive strip may be deposited and etched to define the control gates for all of the storage devices comprising an individual byte. Such a conductive strip is commonly known as a sense line. Sense lines are uniquely decoded for every individual byte by a combination of x and y decoder. A word line (x-line) is another conductive strip comprising a single row in the memory array and designation of a praticular row of x-address in the memory array serves to enable the word line associated with the x-address in preparation for the memory array programming or read operation.

Because the amount of time required to program any individual storage device located along a given word line depends upon the amount of charge applied to the storage device floating gate, the ability to increase the voltage present on the associated word line during memory programming operations, and thus provide a greater charge enables programming times to be signficantly reduced.

In prior art memory arrays, each word line is generally connected to an external high voltage supply through a single small depletion pull-up device which terminates in a pin to the outside of the memory, usually designated Vpp. The depletion device is activated when programming is desired to apply the voltage from the external high voltage supply to a selected word line.

The number of word lines in any given memory array varies with the size of the array. For example, in a 16 K-bit memory arranged in a 128×128 bit array, there are 128 x-lines or word lines. Since only one word line is selected for programming any one byte, there are 127 unselected word lines during any program cycle.

In prior art memory arrays, unselected word lines are held low, or at ground potential, through pull-down devices provided in their associated decoder sections. A DC current path exists between Vpp and ground for all unselected word lines. This current through the 127 unselected word lines in a 128×128 bit array constitutes a drain on the external high voltage supply in the multi-milliampere range.

The recent trend towards the provision of selfaltering intelligent systems has created a need for memory devices which do not require external high voltage power supplies for programming. However, voltages higher than the standard 5 volt power supplies are still necessary for programming purposes. It has been proposed that these higher voltages necessary to achieve acceptable programming times be generated on the memory chip itself. Circuits for voltage multiplication readily adaptable to integration on a memory array chip have been proposed. However, in order for capacitor sizes in those circuits to be reasonably sized for practical integration on a memory array chip, current drive capabilities must be sacrificed. Consequently, such on-chip high voltage generation techniques cannot be implemented where conventional programming circuits are used, especially in larger arrays, since the DC current leakage through the unselected word lines would cause an unacceptable current drain on the high voltage generation circuit, causing its voltage to drop drastically.

SUMMARY OF THE INVENTION

The present invention provides a solution to this problem, whereby no appreciable DC leakage path exists from the high voltage line to ground, and a novel charge pump circuit transfers the high voltage to a selected word line for programming. It makes possible the realization of semiconductor programmable memory arrays having on-chip high voltage generating circuits for providing programming voltages, and thus permits the design of such arrays which operate from a single power supply voltage.

Accordingly, it is an object of the present invention to provide a memory array having word lines which do not draw appreciable leakage current when unselected.

It is a further object of the invention to provide a memory array with on-chip high voltage generation for programming.

It is yet another object of the present invention to provide a memory array which requires only a single power supply.

It is a further object of the invention to provide a memory array word line having a charge pump connected to one end to transfer high voltage from a high voltage line to the word line when it is selected.

BRIEF DESCRIPTION OF THE DRAWINGS

The various objects, features and advantages of the present invention will become more apparent upon consideration of the following detailed description of the invention, wherein:

FIG. 4 is a schematic representation of a semiconductor memory wherein charge pumps transfer high voltage from a high voltage line supplied by an on-chip high voltage generation circuit to supply programming voltage to memory array word lines;

DETAILED DESCRIPTION OF THE INVENTION

Figure 1:
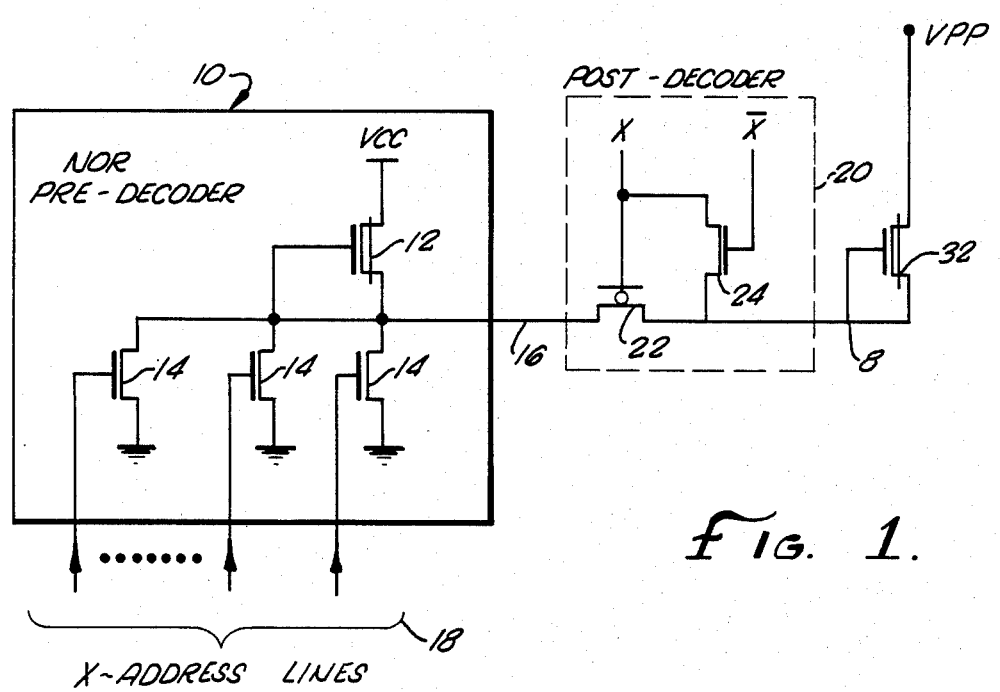
FIG. 1 is a typical prior art circuit used to provide high voltage to a word line selected for programming by associated decoder circuitry.

Referring first to FIG. 1, there is shown a typical prior art circuit for providing a high programming voltage to a word line 8 of a programmable semiconductor memory array such as an erasable programmable read-only memory (EPROM) or an electrically erasable programmable read-only memory (EEPROM).

A typical prior art NOR pre-decoder 10, containing depletion pull-up device 12 and enhancement pull-down devices 14 all connected together at line 16, is illustrated. A number of x-address lines 18 are shown individually connected to the gates of pull-down devices 14. The drains of devices 14 are commonly connected to line 16, as is the source and gate of pull-up device 12. The sources of pull-down devices 14 are commonly connected to ground. NOR pre-decoder 10 is configured such that line 16 is pulled down to ground if the word line 8 with which it is associated is not selected and sits at a voltage close to Vcc if the word line 8 is to be selected. It will be appreciated by those skilled in the art that the number of word lines 8 in any given memory array depends on the size of the array. For example, in a 16 K array arranged in a 128×128 bit matrix, there will be 128 word lines.

The output of NOR pre-decoder 10, at line 16 is fed into post-decoder 20, comprised of transfer device 22, a native MOS transistor having a threshold voltage of approximately zero volts, and enhancement device 24. The gate of transfer device 22 and the drain of enhancement device 24 are connected together and shown connected to a signal source x. The gate of enhancement device 24 is connected to a signal source $\bar{x}$, and its source is connected to word line 8. The source and drain terminals of transfer device 22 connect line 16 to word line 8 when device 22 is conducting. It will be recognized that enhancement device 24 merely serves to pull word line 8 down to ground when it is not selected in order to prevent word line 8 from floating to a voltage level of above zero volts and inadvertently enabling one or more cells which should be deselected.

The source of complementary control signals x and $\bar{x}$ is derived from x-address lines other than the ones used in the corresponding pre-decoder as is known in the art in conventional multiple level decoding circuitry. The combination of decoders 10 and 20 is well known in the prior art and is reviewed here principally to provide a ready reference to the environment in which the present invention operates.

With further reference to FIG. 1, the prior art has provided means by which a programming voltage Vpp of sufficient magnitude to allow reasonable programming times, can be impressed on word line 8 to program the memory cells connected thereto.

The function of device 32 is as a current limiter and is most important if word line 8 is not selected. In such a case, word line 8 sits at approximately zero volts. This may be because line 16 is at zero volts and transfer device 22 is turned on. If, however, transfer device 22 is turned off, device 24 is turned on because x is at zero volts and its complement $\bar{x}$ is at a voltage close to Vcc, causing word line 8 to be at approximately zero volts. A DC current path exists between Vpp and ground (zero volts) for all unselected word lines. Device 32 acts to limit the current through this path. It should be remembered that in memory arrays with which this invention is used, only one word line 8 is selected at any one time while programming a byte. In a memory array arranged in a 128×128 bit format, 127 word lines are unselected at any given time in a programming cycle. Without the use of device 32, even larger amounts of current from the Vpp supply would be wasted.

With respect to EPROMs, which are generally removed from their circuit environment for erasure and reprogramming by a programming device provided for that purpose, this current drain is not a limiting factor since programming devices can supply adequate current to deal with this extra demand caused by the DC paths through unselected word lines.

However, the growing use of EEPROMs presents a problem in this respect. Since they are electrically erasable, they do not have to be removed from the circuit environment in which they operate to be erased and reprogrammed. The extent of the advantage which this capability provides is limited only by the need to supply an external high voltage Vpp to the memory chip for programming. Normally, modern systems can operate from a single +5 volt power supply; it is thus advantageous to avoid the need for an extra power supply in a system when its only use is for reprogramming the memory devices.

Circuits are known which can be embodied into integrated circuit chips for generating voltages sufficient for programming EPROMs and EEPROMs. However, such circuits cannot supply very much current without interfering with the ability of the circuit to maintain voltage level. Their use in such memory arrays is not possible with the use of prior art circuits such as that disclosed in FIG. 1 since the DC current from the unselected row lines places an intolerable current drive burden on the high voltage generating circuit. The present invention provides a solution to this problem and therefore enables memory arrays to be provided with on-chip high voltage generating circuitry.

Figure 2:
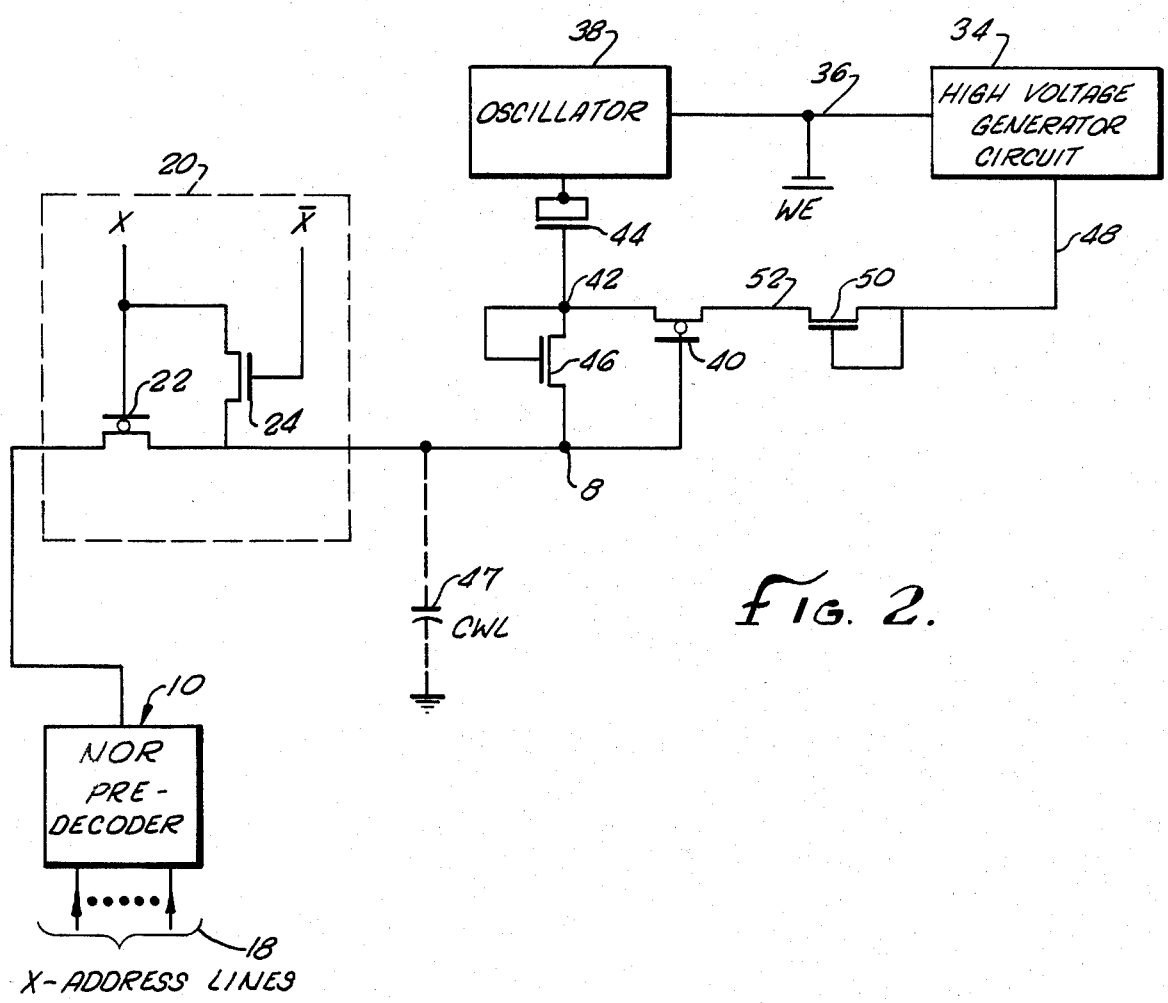
FIG. 2 is a circuit schematic of a charge pump circuit according to the present invention shown connected at one end to a source of high voltage generated on-chip and at its other end to a word line and associated decoder circuitry.

Referring now to FIG. 2, a preferred embodiment of the present invention is illustrated. As with FIG. 1, a NOR pre-decoder 10 and a post-decoder 20, as are known in the art, are used to drive word line 8 in the same manner as disclosed herein with respect to FIG. 1. However, rather than supply Vpp to word line 8 via the circuit means of FIG. 1, the present invention employs a novel combination of circuit elements which co-operate to achieve the objects of the invention.

In place of an externally-supplied Vpp voltage, the present invention may include high-voltage generator circuit 34. Known circuit techniques are used to implement high-voltage generator circuit 34. See On-Chip High Voltage Generation in NMOS Integrated Circuits Using an Improved Voltage Multiplier Technique, IEEE Journal of Solid State Circuits, Vol SC-11, No. 3, June 1976. This circuit may be switched on and off by use of an enable signal at line 36, although this is not necessary. Line 36 is brought to the outside of the chip package and is driven by the signal $\overline{WE}$, a write enable signal frequently used with programmable memory arrays.

Also included in FIG. 2, and shown as enabled by optional line 36, is oscillator 38. Oscillator 38 may be implemented as a ring oscillator or by other means known in the art. The output of oscillator 38 is a square wave varying between zero volts and Vcc having finite rise/fall times and a frequency in the range of several hundred KHz to 10 MHz, the higher frequencies being preferred. Gating the oscillator 38 through line 36 saves current consumption when not programming, but it is not essential to operation of the invention.

The operation of the present invention can be best understood by considering two modes of operation: (1) that when word line 8 is not selected by decoders 10 and 20; and (2) that when word line 8 is selected.

As noted, when word line 8 is not selected, it sits at approximately zero volts because of the action of pull-down devices in decoders 10 or 20. Since the gate of transfer device 40 is connected to word line 8, it must sit at the same voltage as the word line, approximately zero volts. Transfer device 40 is a native MOS transistor and has a threshold voltage of approximately zero volts. Therefore, when word line 8 is not selected, node 42 is at approximately zero volts.

Device 44 couples node 42 to oscillator 38, having its gate terminal connected to node 42 and its source and drain terminals together connected to oscillator 38. In order for device 44 to turn on, the voltage at its gate, i.e., the voltage at node 42, must be greater or equal to the sum of the voltage output of oscillator 38 and the threshold voltage of device 44. Thus, when word line 8 is not selected, device 44 cannot turn on because its gate is sitting at approximately zero volts. Since device 44 remains turned off, no coupling exists between oscillator 38 and node 42.

The gate of device 46, as well as its drain, is connected to node 42. Device 46 is an enhancement device and is turned off when word line 8 is not selected since node 42 is at approximately zero volts. Thus no DC current path exists between word line 8 and the output of high voltage generator circuit 34 when word line 8 is not selected and no current is drawn for unselected word lines.

During programming decoders 10 and 20 have selected word line 8, and it sits at approximately Vcc due to its inherent capacitance $C_{WL}$. This capacitor is shown in phantom lines at 47 between word line 8 and ground. Capacitance 47 is allowed to charge up in the set-up time before the initiation of a programming cycle when selected word line 8 is brought actively to Vcc. During programming word line 8 is dynamically at Vcc; there is no active voltage source holding it at Vcc since device 22 is turned off.

If the output voltage of high voltage generator circuit 34 is assumed to be, for example, +15 volts on line 48, enhancement device 50 will have a voltage of approximately +13.5 volts at its source, connected to line 52. Device 50 acts like a diode since both its drain and gate are connected to line 48; current can only flow from line 48 to line 52 since that is the forward biased direction of the diode which this configuration creates. In the above example, device 50 is assumed to have a threshold voltage of approximately 1.5 volts.

This 13.5 volts on line 52 appears at the drain of transfer device 40 connected thereto. The voltage on word line 8 ($V_{WL}$) appears on the gate of device 40 connected thereto. If $V_{WL}$ is assumed to be 5 volts, the source of device 40 will have approximately 4.5 volts on it if device 40 is assumed to have a threshold voltage of 0.5 volt.

Now where the output of oscillator 38, connected to the source and drain terminals of device 44, goes from zero volts to approximately 5 volts (Vcc), its voltage swing is coupled to node 42. Device 46 is initially turned off since the output voltage of oscillator 38 coupled through device 44 has not brought node 42 to the point where device 46 can turn on. Turn-on of device 46 will occur when its gate voltage, the voltage at node 42 is equal to the sum of its source voltage (the voltage on word line 8) and its threshold voltage. Assuming a threshold voltage of 1 volt, device 46 will turn on when the voltage at node 42 is 6 volts because the voltage on word line 8 is 5 volts.

Since node 42 is initially at 4.5 volts, it must move 1.5 volts in order to reach 6 volts and thus turn on device 46 to pump charge on to word line 8.

In order to produce a voltage swing of 1.5 volts at node 42, the output voltage swing of oscillator 38 is capacitively divided between the capacitance of device 44 ($C_{44}$) and the capacitance of device 46 ($C_{46}$). Therefore, to turn on device 46, the voltage swing at the output of oscillator 38 ($\Delta V_1$) must be:

$$\Delta V_1 \cong 1.5 \left( \frac{C_{44} + C_{46}}{C_{44}} \right) \qquad [A]$$

After device 46 turns on, the capacitive divider network includes the distributed capacitance $C_{WL}$ 47 of word line 8. The remaining portion of the oscillator 38 voltage swing ($\Delta V_2$) is:

$$\Delta V_2 = 5v - \Delta V_1 \qquad [B]$$

and the incremental increase in the voltage in word line 8 ($\Delta V_{WL}$) per positive oscillator voltage swing may be expressed as:

$$\Delta V_{WL} \cong [5v \, v - \Delta V_1] \left[ \frac{C_{44}}{C_{44} + C_{46} + C_{WL}} \right] \qquad [C]$$

In a typical design, $C_{WL}$ is much greater than $C_{44}$, while $C_{44}$ is greater than $C_{46}$. If it is asssumed that $C_{WL} >> C_{44} >> C_{46}$, then it can be seen from equations [A], [B], and [C] that $\Delta V_{WL}$ will be about 0.5 volts.

When the voltage output of oscillator 38 goes from 5 volts to zero volts during its negative transition, node 42 will initially tend to follow it down. However, it will be charged back up from high voltage line 48 to a voltage level somewhat higher than before the previous positive voltage transition of oscillator 38 since $V_{WL}$ has been incremented by $\Delta V_{WL}$ and is thus higher. More specifically, the gate of transfer device 40 is at a value:

$$V_{WL} \text{ (new)} = V_{WL} \text{ (initial)} + \Delta V_{WL} \qquad [D]$$

Thus node 42, which, as previously noted, is determined by subtracting the threshold voltage of transfer device 40 from $V_{WL}$ has been incremented by $\Delta V_{WL}$. At lower levels of $V_{WL}$, no charge will leak back to high voltage line 48 since its voltage is greater than that of word line 8 and node 42. In any event, the diode action of device 50 prevents any such leakage.

After many cycles of oscillator 38, word line 8 will incrementally charge up to the voltage on high voltage line 48, unless limited by the gated breakdown voltage of device 24, if that voltage is less than that of high voltage line 48.

Figures 3A, 3B:
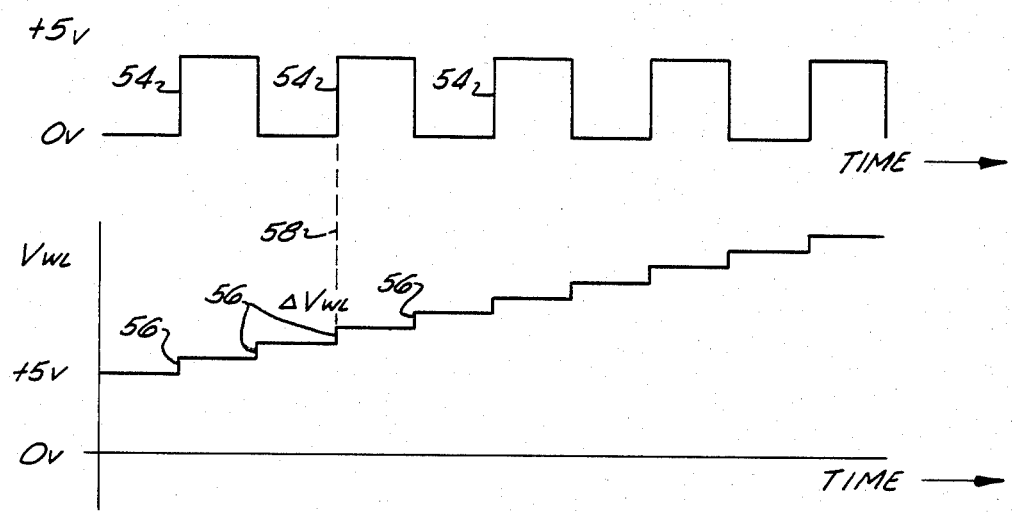
FIGS. 3a and 3b respectively provide graphic representation of a pulse train supplied by an oscillator used to drive the charge pump of the present invention and the word line voltage resulting from operation of the charge pump.

This action is illustrated in FIGS. 3a and 3b. FIG. 3a depicts the voltage output of oscillator 38. It will be noted that for each positive voltage transistor 54, $V_{WL}$ in FIG. 3b is incremented by $\Delta V_{WL}$, shown at 56. The correspondence is noted by dashed line 58.

Thus a scheme for incrementally pumping up the voltage on a word line, which scheme does not draw current through unselected word lines has been disclosed. The instant invention finds particular application with floating gate memory devices such as EPROMs and EEPROMs, but can be used anywhere where an on-chip generation of high voltage is required to supply small amounts of current. It enables the design and implementation of circuits utilizing high voltage, but powered by a single lower voltage power supply.

Although FIG. 2 shows device 50 interposed as an isolation device for high voltage line 48, it is to be understood that its use is optional. In addition, device 40, shown as a native device, may be an enhancement device and/or device 44, shown as an enhancement device may be a native device, as will be recognized by those skilled in the art.

Furthermore, although this disclosure has been made with reference to raising the voltage on a word line in a memory array, those skilled in the art will recognize from the disclosure that other lines, such as y-lines, select lines and write lines may be pumped up to higher voltages by use of this invention. The particular arrangement used with any given memory array will, of course, depend upon the design and layout of the array.

An exemplary embodiment is shown in FIG. 4, which can be a 16 K EEPROM arranged as a 2 K by 8 bit byte-wide array 108. The memory cells 110 in the array are disclosed in co-pending application, Ser. No. 343,847, filed Jan. 29, 1982 and assigned to the same assignee as the present invention, incorporated by reference herein. The programming procedure and voltage requirements are disclosed therein.

FIG. 4 shows schematically how the present invention is implemented in the memory array. The necessary number of charge pump circuits 112 are shown connected to a single high voltage generating circuit 114 and to lines in the memory array which require programming voltages, namely, x-lines (word lines) 116, y-lines 118, 8 write lines 120 (two shown), and the sense line 122. Those skilled in the art will understand the organization and operation of x-decoder 124, y-decoder 126, and the other devices and circuits shown in FIG. 4 which are not necessary to an understanding of the present invention and beyond the scope of the instant disclosure.

While the foregoing has described in detail one embodiment of the present invention, it will be appreciated that, given the teachings herein, numerous equivalents and alternatives which do not depart from the invention will be apparent to those skilled in the art, and those alternatives and equivalents are intended to be encompassed within the scope of the appended claims.

What is claimed is:

1. An apparatus for selectively increasing the voltage on one or more of a plurality of conductive lines having inherent distributed capacitance disposed in a semiconductor circuit comprising:
   means disposed on said semiconductor circuit for selecting one or more of said conductive lines;
   high voltage generating means disposed on said semiconductor circuit for generating a high voltage from a lower voltage power supply connected to said semiconductor circuit;
   voltage pulse generating means disposed on said semiconductor circuit for generating voltage pulses;
   means for capacitively coupling voltage pulses from said voltage pulse generating means to a voltage node in said semiconductor circuit;
   transfer means responsive to said selecting means and connected to said voltage node for transferring increments of charge from said high voltage generating means to the inherent distributed capacitance in selected ones of said conductive lines in response to said voltage pulses;
   said transfer means including switching means cooperating with said selecting means for blocking substantially all of the flow of current through and transfer of charge from said high voltage generating means to said conductive lines which are unselected.

* * * * *